(12) United States Patent
Kundur

(10) Patent No.: US 12,537,533 B2
(45) Date of Patent: Jan. 27, 2026

(54) ASYNCHRONOUS SUCCESSIVE APPROXIMATION REGISTER WITH ASYNCHRONOUS CLOCK CONTROL

(71) Applicant: SKYWORKS SOLUTIONS, INC., Irvine, CA (US)

(72) Inventor: Vinay Kundur, Milpitas, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 65 days.

(21) Appl. No.: 18/409,981

(22) Filed: Jan. 11, 2024

(65) Prior Publication Data

US 2024/0250687 A1 Jul. 25, 2024

Related U.S. Application Data

(60) Provisional application No. 63/480,525, filed on Jan. 19, 2023.

(51) Int. Cl.
| | |
|---|---|
| *H03L 7/183* | (2006.01) |
| *H03L 7/099* | (2006.01) |
| *H03M 1/46* | (2006.01) |

(52) U.S. Cl.
CPC ............ *H03L 7/0992* (2013.01); *H03L 7/183* (2013.01); *H03M 1/462* (2013.01)

(58) Field of Classification Search
CPC ....... H03L 7/0992; H03L 7/183; H03M 1/462

USPC .......................................................... 375/376
See application file for complete search history.

(56) References Cited

U.S. PATENT DOCUMENTS

| 11,190,199 B1* | 11/2021 | Zheng ................... H03M 1/468 |
| 2013/0009796 A1* | 1/2013 | Sakiyama ........... H03M 1/0624 341/110 |

OTHER PUBLICATIONS

Chen et al., "A 6-bit 600 MS/s 5.3-mW Asynchronous ADC in 0.13-um CMOS," IEEE Journal of Solid State Circuits, vol. 41, No. 12, Dec. 2006, pp. 2669-2680.

Fredenburg et al., "A 90-MS/s 11-MHz-Bandwidth 62-dB SNDR Noise-Shaping SAR ADC," IEEE Journal of Solid-State Circuits, vol. 47, No. 12, Dec. 2012, pp. 2898-2904.

Walden, "Analog to Digital Converter Survey and Analysis," Journal of Selected Areas in Communication, vol. 17, No. 4, Apr. 1999, pp. 539-550.

* cited by examiner

*Primary Examiner* — Dominic D Saltarelli
(74) *Attorney, Agent, or Firm* — Lando & Anastasi, LLP

(57) ABSTRACT

A system for determining a variable delay provided to a pulse generator for a successive approximation register analog-to-digital converter (SAR ADC) is presented. The system comprises a delay loop coupled to the pulse generator, the delay loop having a variable delay circuit configured to provide the variable delay to the pulse generator, and an edge selector coupled to the delay loop, the edge selector being configured to determine the variable delay provided to the pulse generator.

20 Claims, 8 Drawing Sheets

ASYNCHRONOUS SUCCESSIVE APPROXIMATION REGISTER WITH ASYNCHRONOUS CLOCK CONTROL

CROSS-REFERENCE TO RELATED APPLICATIONS

This application claims priority under 35 U.S.C. § 119(e) to U.S. Provisional Application No. 63/480,525 titled ASYNCHRONOUS SUCCESSIVE APPROXIMATION REGISTER WITH ASYNCHRONOUS CLOCK CONTROL, filed on Jan. 19, 2023, which is incorporated by reference in its entirety for all purposes.

BACKGROUND

Successive Approximation Register Analog-to-Digital Converters (SAR ADCs) and other devices are controlled by clock signals that determine various aspects of the device's operation, such as when to select and process a sample.

SUMMARY

According to at least one aspect of the present disclosure a system for determining a variable delay provided to a pulse generator is provided. The pulse generator provides, in some examples, pulses to a analog-to-digital converter (ADC). The system comprises a delay loop coupled to the pulse generator, the delay loop having a variable delay circuit configured to provide the variable delay to the pulse generator; and an edge selector coupled to the delay loop, the edge selector being configured to determine the variable delay provided to the pulse generator.

In some examples, the edge selector further comprises a comparator to compare a number of edges to a target number of edges, an edge counter to determine the number of edges and provide the number of edges to the comparator, and a delay counter to set the variable delay based on the number of edges and the target number of edges. In various examples, the delay counter is configured to decrease the variable delay when the number of edges is less than the target number of edges and increase the variable delay when the number of edges is greater than the target number of edges. In many examples, the pulse generator is configured to provide a pulse to the ADC, the pulse having a width based on the variable delay.

In various examples, the ADC has a period of time to complete conversion of a signal from analog to digital form. In some examples, the edge selector adjusts the variable delay such that the ADC utilizes as much of the period of time to complete conversion of the signal as possible without experiencing rollover. In many examples, the variable delay circuit includes at least one register having a plurality of values, each of the values of the plurality of values corresponding to a given length of the variable delay, the at least one register configured to be set by the edge selector.

According to at least one aspect of the present disclosure, a method of utilizing a period of time available to a circuit to complete an operation is provided. The method comprises determining a number of edges detected in the period of time; determining a variable delay based on the number of edges detected and a target number of edges; and adjusting, based on the variable delay, a width of one or more pulses used to control the operation during the period of time.

In some examples, the operation is converting an analog signal to digital form. In various examples, determining the variable delay includes increasing or decreasing the variable delay depending on the number of edges and the target number of edges. In many examples, the variable delay is increased responsive to determining that the operation will take less time than the period of time and determining that the number of edges is greater than the target number of edges. In various examples, the variable delay is decreased responsive to determining that the number of edges is less than the target number of edges. In some examples, adjusting the width of the one or more pulses includes adjusting the width in preset increments between a minimum width and a maximum width.

According to at least one aspect of the present disclosure, a system is provided for utilizing a period of time to complete an operation. The system comprises a successive approximation register analog-to-digital converter (ADC) coupled to a pulse generator, the ADC being configured to convert a plurality of analog values to digital form within the period of time, and the pulse generator being configured to control the ADC to use an amount of time to convert each respective analog value of the plurality of analog values to digital form; and an edge selector configured to determine the amount of time based on a number of edges occurring within the period of time and a target number of edges.

In various examples, the edge selector includes a first counter to count the number of edges detected during the period of time, a comparator to compare the number of edges detected during the period of time to the target number of edges, and a second counter to determine the amount of time and provide the amount of time to the pulse generator. In some examples, the amount of time increases when the number of edges is greater than the target number during the period of time and decreases when the number of edges is less than the target number during the period of time. In many examples, the pulse generator controls the ADC to use an amount of time to convert each respective analog value of the plurality of analog values to digital form by providing a pulse having a width based on the amount of time to the ADC. In some examples, the system further comprises an audio receiver circuit having an antenna, at least one channel, and an output, the ADC, pulse generator, and edge selector being coupled between the at least one channel and the output. In various examples, each edge of the number of edges corresponds to an edge of an input signal to the ADC.

According to at least one aspect of the present disclosure, a system for utilizing an amount of time available to a ADC to convert analog samples to digital form is provided. The system comprises a first counter configured to count a number of edges of a digital signal occurring within the amount of time; a delay loop configured to adjust, based on the number of edges counted by the first counter, the width of one or more pulses used to control converting the analog sample to digital form.

In some examples, the system further comprises a comparator configured to compare the number of edges to a target number of edges, and a second counter configured to determine a variable delay based on the number of edges and the target number of edges. In various examples, adjusting the width of one or more pulses used to control converting the analog sample to digital form includes adjusting the width of the one or more pulses based on the variable delay.

According to at least one aspect of the present disclose, a method for controlling a ADC is provided. The method comprises determining an amount of time for the ADC to convert an analog value having a plurality of sample values into digital form; counting a number of edges occurring within the amount of time; comparing the number of edges to a target number of edges; adjusting the respective amount of time to convert each respective sample value of the plurality of sample values of the analog signal such that the number of edges occurring within the amount of time equals the target number edges.

In some examples, adjusting the respective amount of time to convert each respective sample value of the plurality of sample values includes adjusting a pulse width of a control signal used to control the ADC to convert the respective sample value from analog to digital form.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1A:
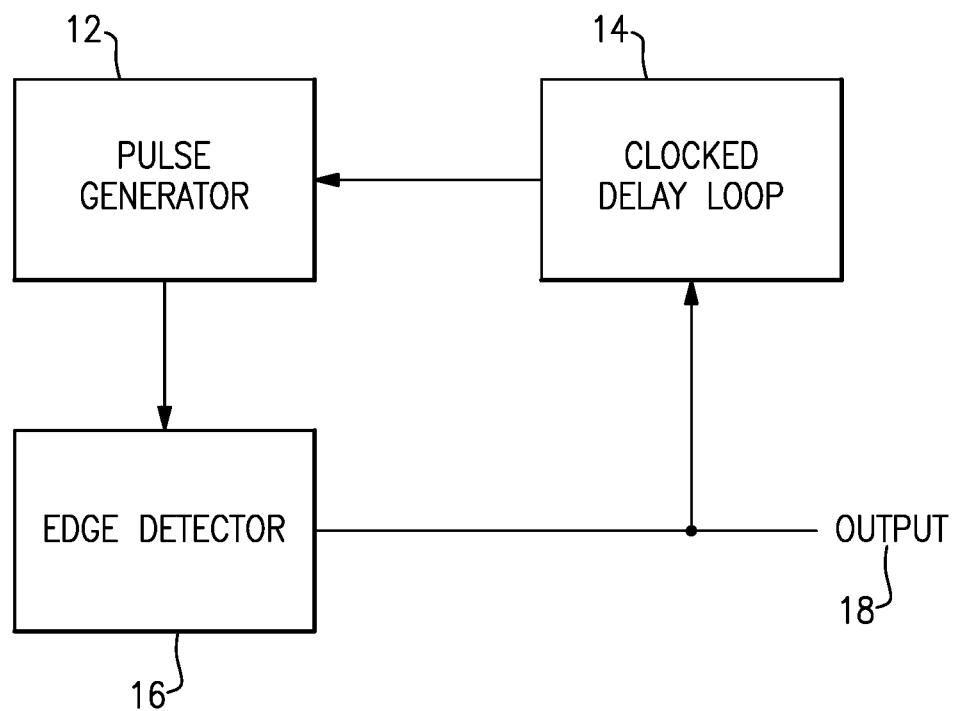
FIG. 1A illustrates an Asynchronous Clock Control Circuit (ACC) according to an example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Successive Approximation Register (SAR) Analog-to-Digital Converters (SAR ADCs) are useful in a variety of applications, including converting analog signals to digital signals. SAR ADCs can rapidly and accurately convert an analog signal into a digital form. In some examples, SAR ADCs are tied to clock signals, meaning the SAR ADC updates during or on an edge of an electrical pulse corresponding to a clock. Each pulse may represent a clock cycle of the clock generating the clock signal. SAR ADCs may take a number of clock cycles to fully convert an analog signal to a digital signal. The minimum number of clock cycles required to convert an analog signal to digital form may correspond to the resolution, in bits, of the SAR ADC. For example, if the SAR ADC has 8 bits of resolution (i.e., the SAR ADC represents the analog voltage of an input signal using 8-bits), the SAR ADC may take 8 clock cycles to convert the analog signal to digital form.

However, because SAR ADCs are generally tied to the clock signal, the SAR ADC may not use all the time available to it to perform its function. For example, a SAR ADC may have 20 nanoseconds (ns) to complete the conversion of an analog signal to digital form. The SAR ADC may have 12 bits of resolution, and thus take 12 clock cycles to complete the conversion of the analog signal to digital form. If each clock cycle is 1 ns, the SAR ADC will use only 12 ns (or 60 percent) of the available 20 ns to convert the analog signal. Using only 60% of the available 20 ns may be inefficient as the SAR ADC may provide a more accurate conversion if it uses more or all of the time available to perform the conversion, may cause less current, on average, to pass through the SAR ADC due to the lower frequency of the pulses, may reduce the frequency of the input signal, may reduce power consumption, and can offer other advantages as well. Thus, if the clock cycles of the SAR ADC could be "stretched" to $$1\frac{2}{3}\text{ns,}$$

the SAR ADC could advantageously use the full 20 ns allocated for conversion.

The current disclosure relates, in at least one aspect, to a self-modulating clocked delay loop and control system for controlling a SAR ADC. The self-modulating clocked delay loop can "stretch" and "squash" the input pulses provided to the SAR ADC, allowing the SAR ADC to use as much time as possible to perform its function. For example, the clock loop and control system may control a SAR ADC to use as much time as possible to convert a signal from analog to digital form. The self-modulating clocked delay loop allows the control circuit to account for variations in process, voltage, temperature, and other factors ("PVT factors") that can impact how much time a SAR ADC takes to complete a conversion of an analog signal to digital form.

For the purposes of clarity and simplicity, in the following discussion, SAR ADC shall be used to refer to a Successive Approximation Register Analog-to-Digital Converter. However, any sort of device that performs functions over successive periods of time may benefit from the methods and systems described herein, and the disclosure is not limited to only SAR ADCs. The techniques described herein can be used to manipulate any sinusoidal or pulsed signal.

FIG. 1A illustrates an Asynchronous Clock Control Circuit 10 ("ACC 10") for generating pulses for a successive approximation register (not shown). The ACC 10 includes a pulse generator 12, a clocked delay loop 14 ("delay loop 14"), an edge detector 16, and an output 18.

The pulse generator 12 is coupled to the delay loop 14 and the edge detector 16. The output 18 is coupled to the edge detector 16 and delay loop 14. The delay loop 14 and edge detector 16 are coupled to one another.

The pulse generator 12 provides pulses to a SAR ADC (not shown). The pulses act as a control signal, controlling the SAR ADC to sample a signal and convert the signal from analog to digital form. Because the SAR ADC is a successive approximation device, each pulse corresponds to a successive approximation of the signal's analog value. That is, as described above, the pulse generator 12 provides n pulses, where n is the resolution of the SAR ADC. In general, each pulse of the n pulses will be provided on a sequential clock cycle. Each pulse will correspond to an increasingly refined (or accurate) representation of the analog signal's value in digital form. In many cases, the SAR ADC is performing a binary search to determine the digital value of the analog signal.

The delay loop 14 provides a delay signal to the pulse generator. The delay, $\Delta\tau$, indicated by the delay signal corresponds to a period of time for which the SAR ADC is allowed to sample a particular voltage value of the analog signal. That is, supposing that the SAR ADC normally will sample the analog signal every 1 ns, the delay, $\Delta\tau$, may increase the amount of time for the SAR ADC to complete the sample and/or sampling process to 1 ns+$\Delta\tau$. In other examples, the delay may become the new sample period, such that the samples are taken every $\Delta\tau$ units of time (seconds, nanoseconds, and so forth). In some examples, the delay signal acts as an enable signal, such that the pulse generator 12 cannot instruct the SAR ADC to perform the next successive approximation of the analog signal value until after the delay has ended.

The edge detector 16 provides a signal to the delay loop 14 and the output 18 indicating when (and, in some cases, if) the SAR ADC has completed the sample and "settled" on a value and/or approximation for a given successive approximation.

Figure 1B:
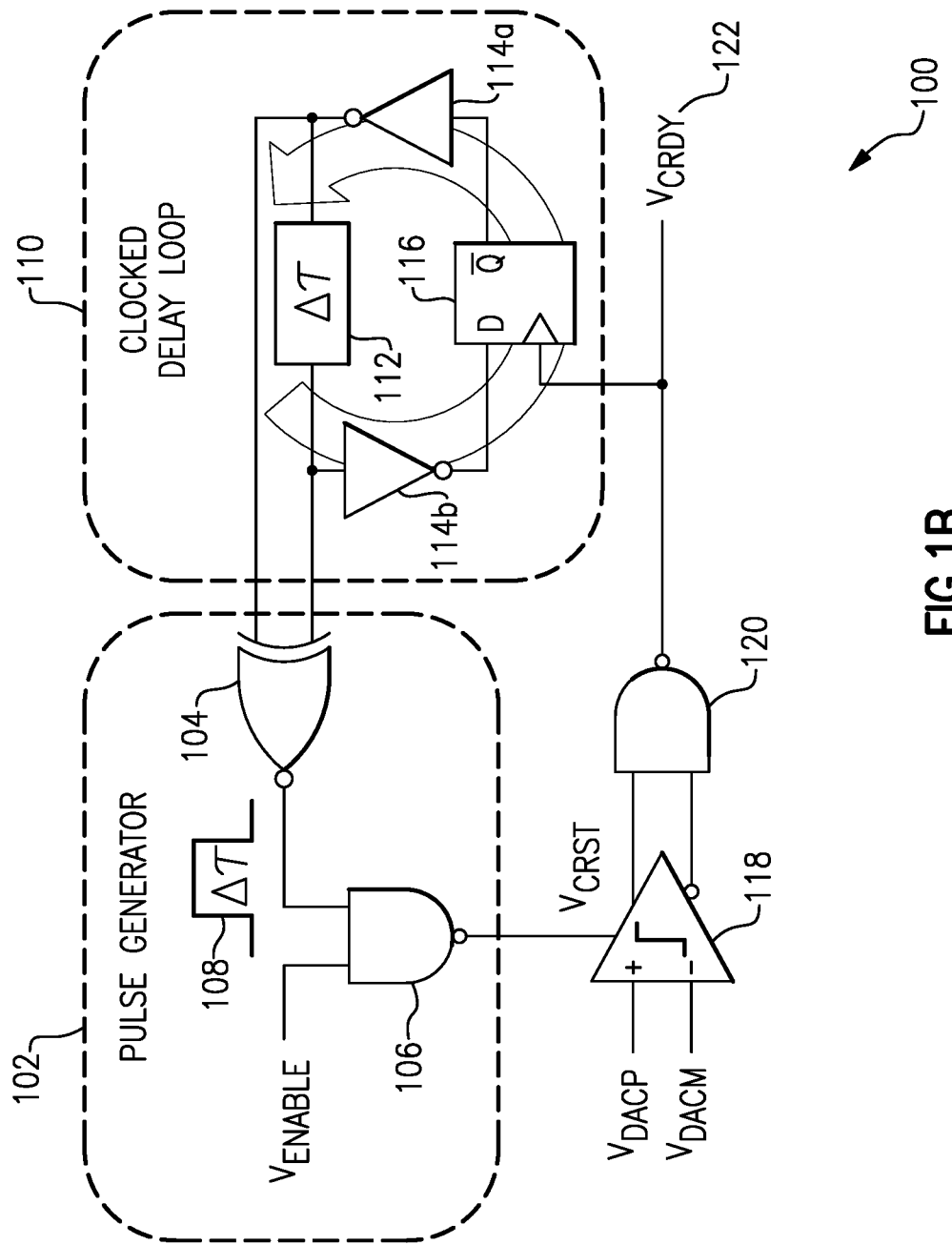
FIG. 1B illustrates an ACC according to an example.

FIG. 1B shows an Asynchronous Clock Control Circuit 100 ("ACC 100") according to an example. The ACC 100 includes a pulse generator 102 having a not-exclusive-or gate 104 ("XNOR 104" or "XNOR gate 104"), a not-and gate 106 ("NAND 106" or "NAND gate 106"), a pulse of width $\Delta\tau$ 108 ("pulse 108"), a clocked delay loop 110 ("delay loop 110") having a delay circuit 112, two inverters 114a, 114b, and a register 116 (shown as a D-type flip-flop), as well as a differential comparator 118 ("comparator 118") and a not-and gate 120 ("NAND 120" or "NAND gate 120"), and an output 122.

The ACC 100 is a more detailed embodiment of the ACC 10 of FIG. 1A. The pulse generator 102 corresponds generally to the pulse generator 12 of FIG. 1A, the delay loop 110 corresponds generally to the delay loop 14 of FIG. 1A, the comparator 118 and NAND gate 120 correspond generally to the edge detector 116 of FIG. 1A, and the output 122 corresponds generally to the output 18 of FIG. 1A.

The pulse generator 102 provides a pulse to an SAR ADC, as described with respect to FIG. 1A. The XNOR gate 104 provides a signal to the NAND gate 106 only when either both inputs to the XNOR gate 104 are low (i.e., logical zero or simply zero) or when both inputs to the XNOR gate 104 are high (i.e., logical one or simply one). The XNOR gate 104 provides the pulse 108 to the NAND gate 106 for a period of time at least equal to $\Delta\tau$, which is the length of the delay. The NAND gate 106 provides an output to the comparator 118 provided that both VENABLE and the output of the XNOR gate 104 are not both high (i.e., one) at the same time.

The delay loop 110 provides a fixed delay signal having a width of $\Delta\tau$ to the pulse generator 102. In some examples, the delay loop 110 has two outputs coupled to the inputs of the XNOR gate 104 of the pulse generator 102. The first output corresponds to the output of the first inverter 114a. The second output corresponds to the output of the first inverter 114a, but delayed by $\Delta\tau$ (or, in some examples, stretched to a width of $\Delta\tau$ as part of a sample and hold operation by the delay circuit 112). The register 116 has an input "D" and an output "$\overline{Q}$" as well as a clock input. The clock input receives the output of the NAND gate 120 and controls when the register updates the value of $\overline{Q}$. The D input receives the output of the second inverter 114b, and the $\overline{Q}$ output provides the input to the first inverter 114a. The delay loop 110 provides the fixed delay signal having the width $\Delta\tau$ to the pulse generator 102 by controlling the two inputs to the XNOR gate 104.

The NAND gate 120 provides a high output (equal to the output of the NAND gate 106) to the output 122 and register 116 whenever the two inputs to the NAND gate 120 are not both high. The comparator 118, as illustrated, provides two high inputs to the NAND gate 120 whenever $V_{DACP}$ is greater than $V_{DACM}$. Thus, the NAND gate 120 provides the high output whenever $V_{DACP}$ is less than $V_{DACM}$.

As described herein, an object of the present disclosure is to provide a circuit that maximizes the amount of time available for the SAR ADC to perform its approximations and/or conversion of an analog signal into digital form. Returning to the earlier example given, the SAR ADC may have 20 ns to complete the conversion, but may only use 12 ns (assuming each clock cycle is 1 ns and the SAR ADC has 12 bits of resolution). The delay, $\Delta\tau$, may therefore be up to $$1\frac{2}{3}\text{ns}$$

(or, alternatively phrased, may represent an increase of up to ⅔ ns over the 1 ns already used by the SAR ADC). To get the desired delay, the delay circuit (e.g., delay circuit 112) is designed to provide a set (or fixed) delay corresponding to the amount of delay desired to maximize the use of time and to get the best approximation possible of the analog value in digital form.

However, real-world considerations make it difficult to design a one-size-fits-all delay circuit. In real world fabrication, circuits may have fast process corners, slow process corners, and "typical" process corners representing differences in the silicon and construction of the circuits themselves. A "fast process corner" may correspond to a circuit of an identical design to another circuit that performs faster than expected. A "slow process corner" may correspond to a circuit of an identical design to another circuit (e.g., the fast process corner circuit), but that performs slower than expected. And a "typical process corner" may correspond to a circuit of an identical design to another circuit that performs more-or-less as expected.

Thus, for a given SAR ADC (such as the 12-bit resolution SAR ADC of the foregoing examples), the fast process corner may include circuits that perform conversions in 9 ns, the typical process corner may include devices that perform conversions in 12 ns, and the slow process corner may include circuits that perform conversions in 15 ns. The delay for the 12 ns, typical process corner, circuit would cause the slow process corner circuit to rollover (that is, the slow circuit would not be able to fully complete the approximation in the time allotted. This is because the $$1\frac{2}{3}$$

delay factor used for the original 12 ns conversion time would increase the conversion time for the slow process corner from approximately 15 ns to 25 ns $$\left(\text{i.e.: } 15 \cdot 1\frac{2}{3} = 25\right),$$

which is more than the allotted 20 ns for conversion. Likewise, the fast process corner would use only 15 ns $$\left(\text{i.e.: } 15 \cdot 1\frac{2}{3} = 15\right),$$

leaving a full 5 ns unutilized by the SAR ADC.

Thus, each circuit would need to be tested somehow during fabrication to determine if the circuit was a fast, slow, or typical process corner circuit, and each delay circuit and/or delay loop would need to be custom designed to most efficiently use the time allotted for SAR ADC conversion. Such an approach requires the fabricator to test SAR ADCs during fabrication and dynamically compose appropriate delay circuits unique to each SAR ADC.

Figure 2A:
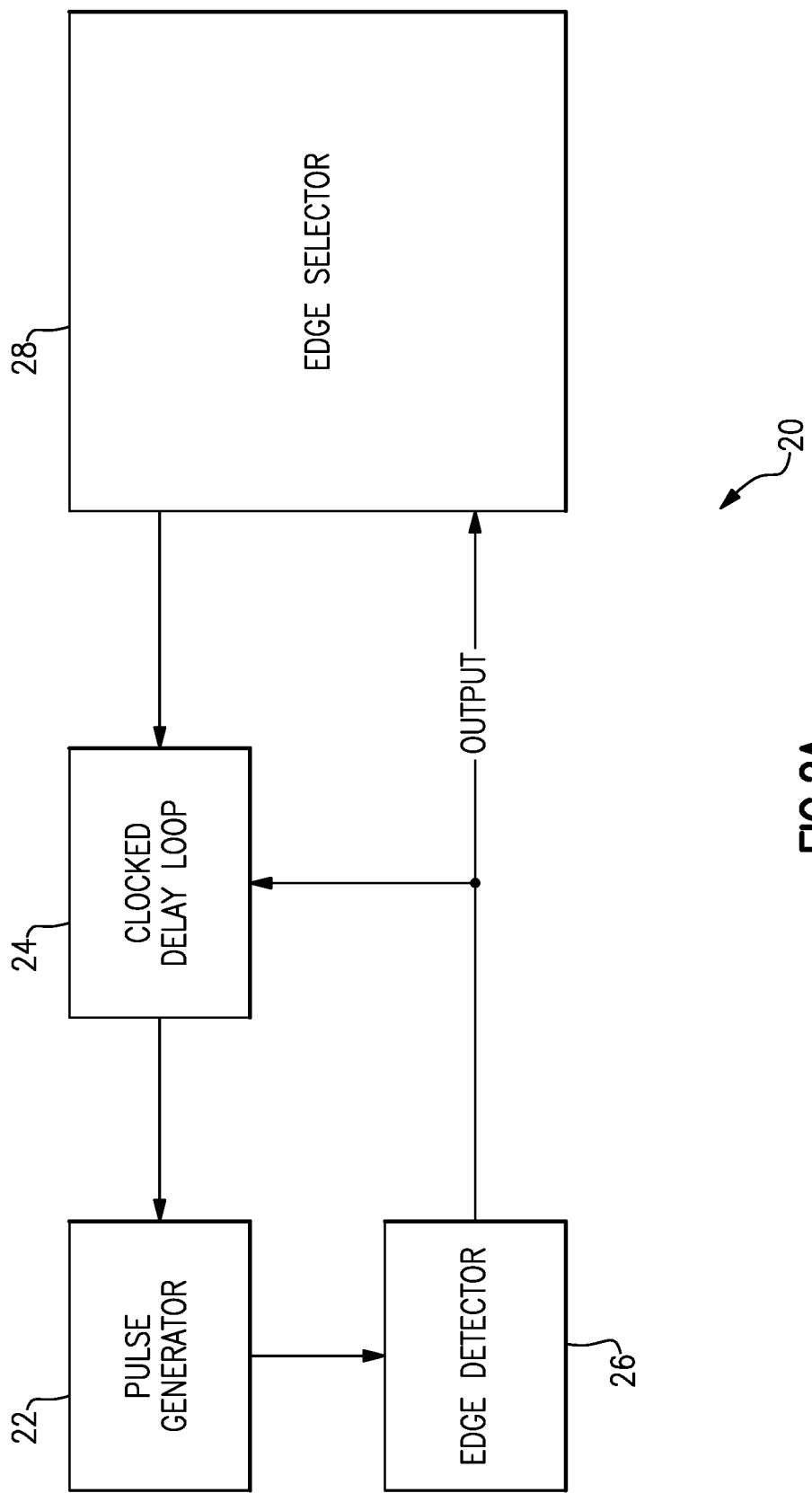
FIG. 2A illustrates an ACC according to an example.
Figure 2B:
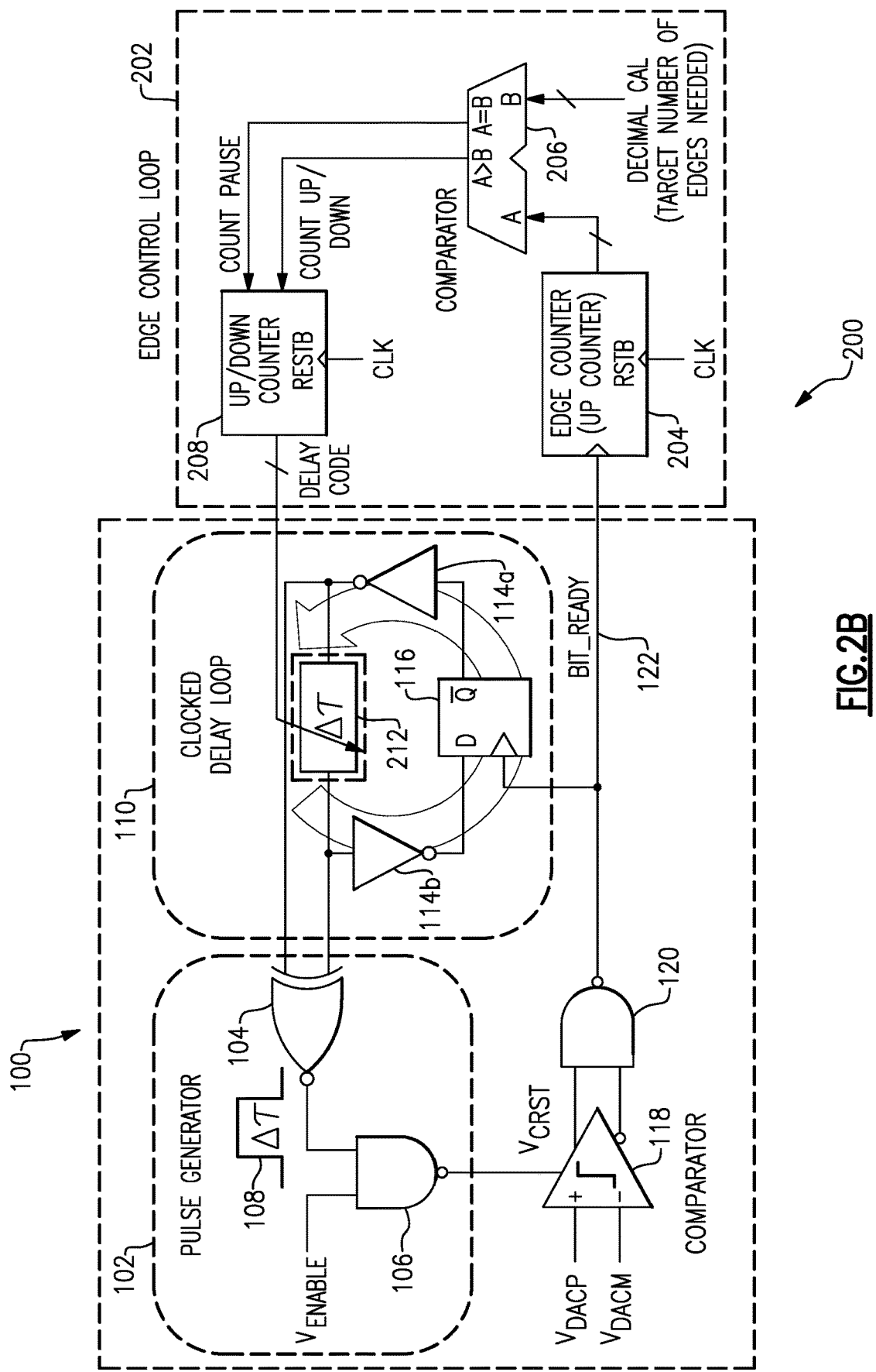
FIG. 2B illustrates an ACC according to an example.

FIGS. 2A and 2B present asynchronous clock control circuits with variable delays. By allowing for variable delays (e.g., variable delay factors), the circuits of FIGS. 2A and 2B eliminate the need for testing of SAR ADCs during fabrication and provide a powerful compromise between maximum efficiency of each individual SAR ADC and the cost and efficiency of designing unique delay circuits and/or delay loops for each respective SAR ADC.

FIG. 2A illustrates an asynchronous clock control circuit (ACC) 20 having a pulse generator 22, a delay loop 24, an edge detector 26, and an edge selector 28. An output is also shown.

The pulse generator 22 and edge detector 26 of the ACC 20 are, in some examples, similar in function and design to the pulse generator 12 and edge detector 16 of the ACC 10 of FIG. 1A. The primary difference between the circuits of FIGS. 1A and 1B and FIGS. 2A and 2B is the addition of the edge selector 28 in FIGS. 2A and 2B and the fact that the delay loop 24 now provides a variable delay, also called $\Delta\tau$, to the pulse generator 22 in FIGS. 2A and 2B.

As with the ACC 10, the pulse generator 22 provides pulses that control the SAR ADC to begin a given approximation of the successive approximations the SAR ADC performs when converting an analog signal to digital form. The pulse generator 22 is coupled to the delay loop 24 and to the edge detector 26.

The delay loop 24 provides a signal (or pulse) to the pulse generator 22 with a width of $\Delta\tau$, the variable delay. The variable delay corresponds to the amount of time the pulse generator 22 will take between sending a signal to the SAR ADC to enable the SAR ADC to perform the next approximation of the successive approximations. In some examples, the variable delay, $\Delta\tau$, is the minimum period of time allocated to a particular approximation. The delay loop 24 is coupled to the pulse generator 22, edge detector 26, and edge selector 28.

The edge detector 26 provides a signal to the delay loop 24 and the edge selector 28 indicating when (and, in some cases, if) the SAR ADC has completed the sample (e.g., approximation) and "settled" on a value and/or approximation for a given successive approximation. The edge detector 26 is coupled to the pulse generator 22, delay loop 24, and edge selector 28.

The edge selector 28 determines the length of the variable delay, $\Delta\tau$. The edge selector 28 detects an edge of a pulse from the edge detector 26. This pulse edge corresponds to an approximation of the successive approximations. For example, in the case of the earlier given example where the SAR ADC has 20 ns to complete the successive approximation, and each pulse has a period of 1 ns, the edge selector 28 can detect a rising edge (or a falling edge, or both) approximately every 1 ns. For the purposes of simplicity and clarity, the following discussion will assume that rising edges are detected, but rising edges, falling edges, or any other type of detectable edge may be used without limitation. The edge selector 28 compares the number of edges detected during the time allocated for conversion (e.g., the time allocated for the successive approximation—for example, 20 ns in the above examples) against the number of bits of resolution of the SAR ADC. If the number of edges is greater than and/or equal to the number of bits of resolution of the SAR ADC, the edge selector increases the variable delay, $\Delta\tau$. If the number of edges is less than the number of bits of resolution of the SAR ADC, the edge selector decreases the variable delay, $\Delta\tau$. The following example illustrates what is happening here:

Suppose 20 ns are allocated to the conversion by the SAR ADC, and the SAR ADC has 12 bits of resolution with pulses having a 1 ns period (this is the same as the earlier examples). If the edge selector detects 10 edges in 20 ns, this means the variable delay, $\Delta\tau$, is too long because too few edges were detected. Too few edges being detected means that some edges occurred or would have occurred outside the 20 ns allocated for conversion—this is called rollover of the edges, or just rollover. Accordingly, the variable delay, $\Delta\tau$, is too long and should be shortened. The edge selector 28 may therefore adjust the variable delay to be shorter.

Now suppose that at least 12 edges are detected during the 20 ns period of time allocated for conversion by the SAR ADC. This situation implies that either (1) the full 20 ns were used for conversion by the SAR ADC, or (2) that the SAR ADC is not using the full 20 ns available to it to perform the conversion. Accordingly, the variable delay, $\Delta\tau$, may be able to be increased so that the SAR ADC uses more of the available 20 ns. The edge selector 28 may therefore adjust the variable delay to be longer.

The edge selector 28, being a physical device, will generally have a minimum resolution by which it can adjust the variable delay, $\Delta\tau$. Suppose, for example, the edge selector 28 has a resolution of 5 bits, corresponding to 32 possible states. Then the variable delay, $\Delta\tau$, may have 32 possible values ranging between a minimum value (for example, zero or no additional delay), and a maximum value (for example, 0.31 ns of additional delay), each value corresponding to a unique value of the 5 bits of resolution allocated to the edge selector 28 (in this particular example, which is for illustrative purposes only, each bit of resolution corresponds to 0.01 ns of additional delay). As a result of the minimum resolution of the edge selector 28, the edge selector 28 may only be able to adjust the delay by a discreet step value (in this example, 0.01 ns). As a result, the edge selector 28 may reach a point where increasing the variable delay by one step causes rollover of the edges, and adjusting the variable delay back down by one step causes the correct number of edges to be detected by the edge selector 28. At this point, the edge selector may stop adjusting the variable delay, $\Delta\tau$. The edge selector 28 may also later adjust the variable delay, $\Delta\tau$, if the edge selector 28 no longer detects the appropriate number of edges. Alternatively, the edge selector 28 may periodically recalibrate the variable delay, $\Delta\tau$, to ensure the SAR ADC uses as much time as possible to perform the conversions.

The edge selector 28 may set the variable delay, $\Delta\tau$, by adjusting the delay circuit of the delay loop 24, as will be discussed with respect to FIG. 2B.

FIG. 2B illustrates an Asynchronous Clock Control Circuit 200 ("ACC 200") according to an example. The ACC 200 is largely identical to the ACC 100 of FIG. 1B, with the exception of the edge selector 202 and variable delay circuit 212.

The ACC 200 includes the ACC 100, the ACC 100 having a variable delay circuit 212, and an edge selector 202 having a first counter 204, a comparator 206, and a second counter 208.

The ACC 100 operates as described with respect to FIG. 1B herein, with the sole exception that the delay circuit 112 has been replaced with a variable delay circuit 212. The variable delay circuit 212 can be controlled by the edge selector 202 to provide a delay of variable length to the pulse generator 102. In some examples, the variable delay circuit 212 may be a series of MUX circuits that are activated, partially activated, or deactivated depending on the length of the desired delay. However, any delay circuit topology that can provide a controllable variable delay may be used.

The edge selector 202 is coupled to the NAND gate 120 and to the delay loop 110—specifically, to the variable delay circuit 212 of the delay loop 110. The first counter 204 is coupled to the comparator 206. The comparator 206 is coupled to the second counter 208, and the second counter 208 is coupled to the variable delay circuit 212.

The first counter 204 counts the number of edges (via the NAND gate 120) detected during a given period of time. For example, in the foregoing examples, the first counter would count each edge during the 20 ns allocated to conversion by the SAR ADC. The first counter 204 provides the number of edges detected to the comparator 206. The comparator 206 compares the number of edges detected to a target number of edges. The target number of edges may be equal to the resolution of the SAR ADC (i.e., 12 for a 12-bit SAR ADC, 13 for a 13-bit SAR ADC, and so forth), or may be any number desired by the designer. In some examples, for instance, it may be desirable to allow an extra clock cycle or edge to be detected so as to reduce the likelihood that random variations in temperature or operating conditions cause rollover. Thus, for a 12-bit SAR ADC, in some examples 13 edges could be detected, or 14 edges, or another value greater than 12.

The comparator 206 provides outputs that control the second counter 208. A first output may control the second counter 208 to increment or decrement by a value of one or more, and the second output may control the second counter 208 to remain at its current value, for example, as when the number of edges detected by the first counter 204 equals the target number of edges at the comparator 206.

The second counter 208 controls the variable delay circuit 212. The second counter 208 provides a control signal to the variable delay circuit 212 corresponding to a value of the variable delay, $\Delta\tau$. In some examples, the control signal provided by the second counter 208 has a finite number of discrete states, and each discrete state corresponds to a different length of delay.

When the ACC 200 is activated, it is not a given that the ACC 200 will apply a desirable and/or correct amount of delay. That is, the variable delay circuit 212 may not be set to a value that maximizes the amount of time the SAR ADC takes to perform the conversion of a signal from analog to digital form without rollover. Therefore, in some examples, the ACC 200 needs to determine the length of the delay or the value to set the variable delay circuit 212 to get the desired number of edges in the time allocated to SAR ADC conversion.

To determine the length of the delay or a related value, the ACC 200 can engage in a search. The search is, in some examples, executed in the edge selector 202. Searches include linear searches, binary searches, and any other type of search known in the art or implementable using a computer circuit. As illustrated, the ACC 200 engages in a linear search. In a linear search, the edge selector 202 steps through possible delay values one at a time, in sequential order, until rollover is detected. For example, the edge selector 202 can decrease the delay be 1 increment or increase it by 1 increment until rollover occurs. When rollover occurs, the edge selector 202 can go back to the value of delay immediately proceeding rollover, and if the desired number of edges is detected, can hold at that value. If the desired number of edges is not detected, the edge selector 202 can continue to the next proceeded value, and so forth, until the desired number of edges is detected.

An example of a linear search using the edge selector 202 follows: suppose the edge selector is applying no delay (e.g., the second counter 208 is at a value of 0, or whatever value is chosen to correspond to no delay in the variable delay circuit 212). Suppose the desired number of edges is 13 (possibly corresponding to 12 bits of resolution for the SAR ADC and a single additional edge to allow some room in the event a change in PVT characteristics cause the SAR ADC to speed up or slow down). Suppose the first counter 204 detects 15 edges in the time allocated for conversion. This is 2 edges too many. Because no delay is currently applied, the comparator 206 provides a signal to the second counter 208 to increase. The second counter 208 increases by 1, which causes the variable delay circuit 212 to apply a small amount of delay corresponding to a value of 1 in the second counter 208. Suppose in the next period of time allocated for conversion, the first counter 204 counts 15 edges again. Therefore, the delay is insufficient, and the comparator 206 signals the second counter 208 to increase by 1 to a value of 2. The variable delay circuit 212 correspondingly adjusts the delay to the amount of delay corresponding to a value of 2. This process can continue, with the second counter 208 increasing by 1 (and the variable delay circuit 212 being correspondingly adjusted) until the first counter 204 counts 13 edges in the time allocated for conversion by the SAR ADC. When 13 edges are counted by the first counter 204, the comparator 206 may send a signal to the second counter 208 instructing the second counter 208 to remain at the current value. Alternatively, the comparator 206 could send a signal to the second counter 208 to increase, and could continue to do so until rollover is detected, at which point the comparator 206 could send a signal to the second counter 208 to decrease. The second counter 208 could continue to decrease until 13 edges are counted by the first counter 204, at which point the comparator 206 could instruct the second counter 208 to remain at the same value until less or more than 13 edges are counted by the first counter 204.

The above describes two linear searches, one increasing until 13 edges are counted, and the other increasing until rollover is detected, and then decreasing. These searches both would result in delay amounts for the variable delay circuit 212 that, while not necessarily the same, would result in 13 edges counted by the first counter 204. Note that, in some examples, the delay applied may cause the number of edges counted by the first counter 204 to change by more than 1. For example, if the second counter increased from 3 to 4, the number of edges counted could change from 14 to 12. In such cases, the edge selector 202 could be configured to continue searching or to hold at a value corresponding to the closest value to 13 edges less than 13, or hold at the closest value to edges to 13 greater than 13 (e.g., hold at a delay that produces 12 edges or a delay that produces 14 edges, or continue searching until 13 edges can be achieved).

However, the edge selector 202 is not limited to linear searches. A binary search could be implemented instead. In a binary search, the edge selector 202 could, in one example, start the second counter 208 at 0, then increase it to one-half the total value the second counter 208 can count to, then increase or decrease the edge selector by one-quarter the total value the second counter 208 can count to, and then by one-eight, then one-sixteenth, and so forth. Other types of searches may also be used, and there are many search algorithms that are well-known in the art which could be used to get the second counter 208 to a value or values that corresponds to a delay in the variable delay circuit 212 that produces the desired number of edges.

As with ACC 20, the ACC 200 may periodically recalibrate the variable delay, may calibrate the variable delay on startup, and/or may calibrate the variable delay on demand.

The ACC 200 does not need to be set to provide a delay that produces a number of edges in the time allotted for conversion equal to the resolution (in bits) of the SAR ADC. The ACC 200 may be set to provide a delay corresponding to a desired number of edges, for example, less than or more than the resolution of the SAR ADC. In some embodiments, for example, an additional edge is counted.

Figure 3:
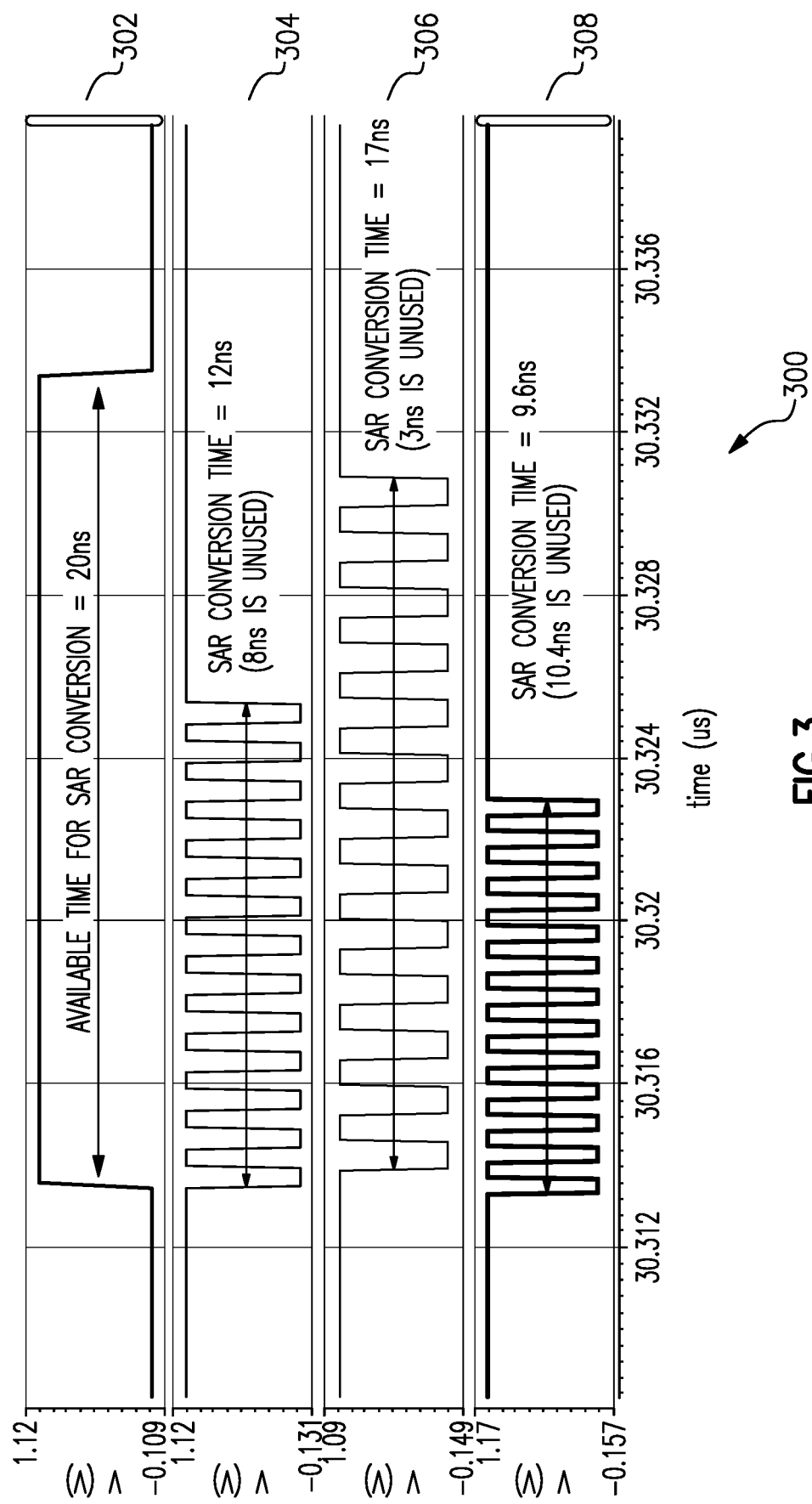
FIG. 3 illustrates a graph comparing time for conversion by a SAR ADC to various corners of a process according to an example.

FIG. 3 illustrates a graph 300 comparing time for conversion by a SAR ADC to fast, slow, and typical process corners of a SAR ADC circuit. The graph 300 includes a first trace 302 indicating the time allowed for SAR ADC conversion, a second trace 304 indicating the SAR ADC conversion time under typical conditions (i.e., the typical process corner), a third trace 306 indicating the SAR ADC conversion time under slow conditions (i.e., the slow process corner), and a fourth trace 308 indicating the SAR ADC conversion time under fast conditions (i.e., the fast process corner). In some cases, the slow, fast, and typical process corners correspond to the process (i.e., the SAR ADC itself and the qualities of the particular components used in the SAR ADC's fabrication), and/or the voltage (i.e., the voltage and/or power provided to the SAR ADC can affect how quickly it operates, with more power/higher voltage generally corresponding to faster operation), and/or the temperature (i.e., the temperature can also affect SAR ADC operation, with lower temperatures generally corresponding to slower operation and higher temperature generally corresponding to faster operation within normal operating temperature ranges), and/or other factors. The fast, slow, and typical process corners do not necessarily imply only, exclusively, or necessarily the process factors, but can be due to other factors exclusive of the process factors or in conjunction with the process factors.

In the graph 300, each of the process corner traces 304, 306, 308 represent the number of pulses and time taken by the SAR ADC to complete conversion without any variable delay applied to any of the corresponding pulses generated by the pulse generator (e.g., pulse generator 22) by the delay loop (e.g., delay loop 24) as determined by the edge selector (e.g., edge selector 28). As can be seen, of the 20 ns available for conversion, as indicated by trace 302, the typical process corner took 12 ns, the slow process corner took 17 ns, and the fast process corner took approximately 9.6 ns.

Figure 4:
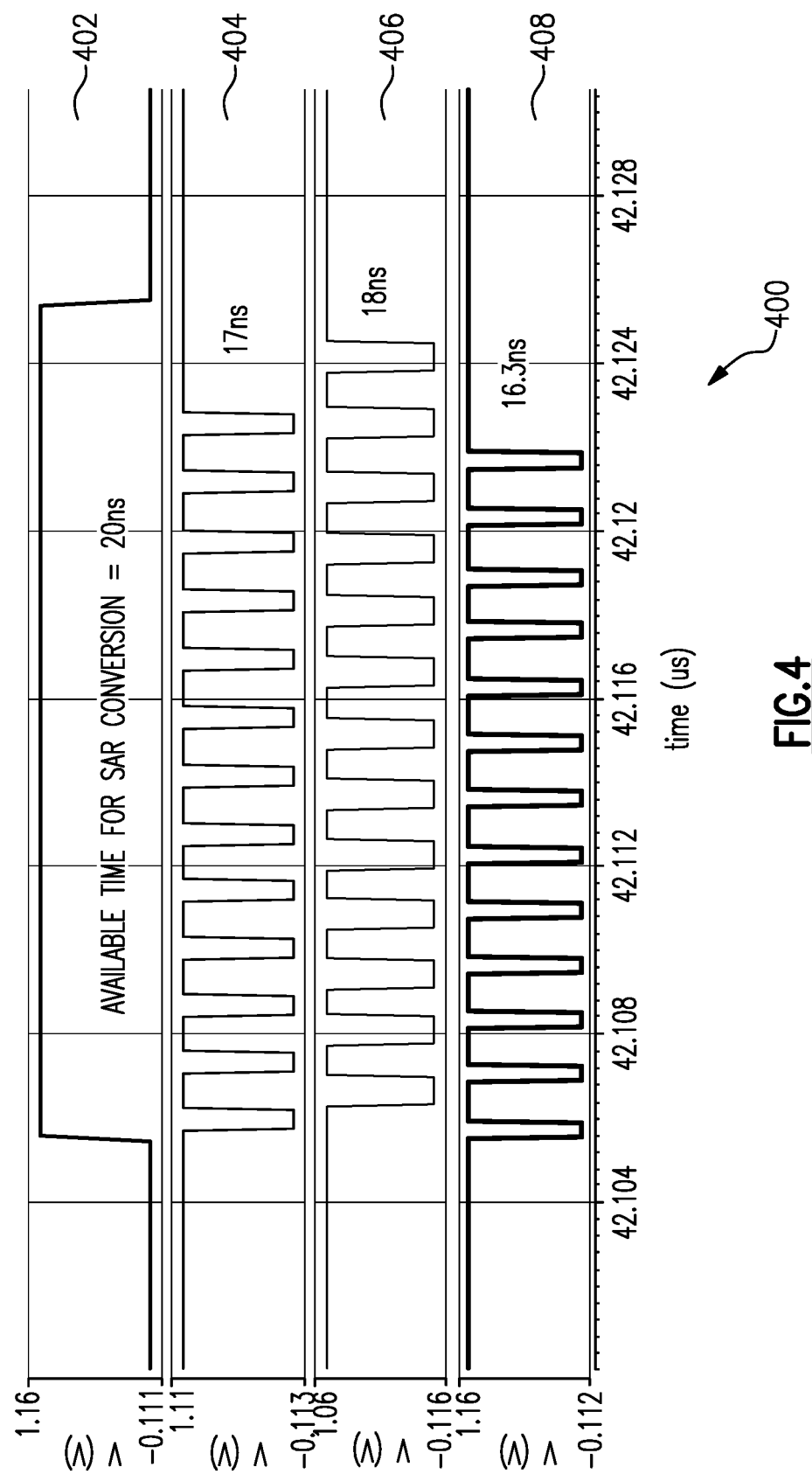
FIG. 4 illustrates a graph comparing time for conversion by a SAR ADC to various corners of a process when a variable delay is applied according to an example.

FIG. 4 illustrates a graph 400 wherein a variable delay has been applied to each trace. The graph 400 includes a first trace 402 indicating the time available for conversion by the SAR ADC, a second trace 404 corresponding to the typical process corner, a third trace 406 corresponding to the slow process corner, and a fourth trace 408 corresponding to the fast process corner.

The first trace 402 indicates that 20 ns was allocated for conversion by the SAR ADC. With a respective variable delay applied to each of the typical, slow, and fast process corners of the process corner traces 304, 306, 308, the typical process corner now takes 17 ns, the slow process corner now takes 18 ns, and the fast process corner now takes 16.3 ns. The amount of unutilized conversion time is greatly reduced by the variable delays applied to each process corner.

Of particular importance, the variable delays applied to the typical, slow, and fast process corners are each different. The conversion in the typical process corner without a delay took 12 ns, while with the conversion in the typical process corner with a delay took 17 ns. The delay factor between the two is thus approximately 1.42 (that is, the typical process corner with variable delay took approximately 1.42 times longer than without delay), or an increase of approximately 0.42 ns per pulse. The delay factor for the slow process corner was approximately 1.06, or an increase of approximately 0.08 ns per pulse. The delay factor for the fast process corner was approximately 1.70, or an increase of approximately 0.56 ns per pulse.

Because the conversion process involves the edge selector (e.g., edge selector 28) searching for the appropriate delay to maximize and/or increase SAR ADC conversion time without rollover, whatever the reason is for a given SAR ADC being in the fast, slow, or typical process corner, the edge selector is agnostic to the reason and will simply adjust the variable delay.

Returning to FIG. 3, note that the fast process corner requires 9.6 ns. As a result, the fast process corner is operating at nearly twice the frequency compared to the slow process corner of FIG. 3. This massive difference in frequency can have profound implications for those parts of the circuit, for instance capacitive and inductive components, that have qualities which depend on frequency. Likewise, the high frequency of the pulses in the fast process corner can correspond to a large but short surge in current that can—in some examples—damage or interfere with the SAR ADC.

By comparison, FIG. 4, with the variable delays applied to each of the typical, slow, and fast process corner, has considerably less variation in pulse frequency between each process corner. As a result, SAR ADCs using the variable delay circuitry will tend to have closer SAR ADC conversion frequencies, providing some guarantee to engineers and others that a particular SAR ADC manufactured with these components will perform the same or nearly the same as any other SAR ADC manufactured with these components. The relative similarity between slow, typical, and fast process corners of SAR ADCs manufactured with the variable delay circuitry therefore lessens or eliminates the impetus to make design decisions based on the frequency dependent characteristics of SAR ADCs.

Figure 5:
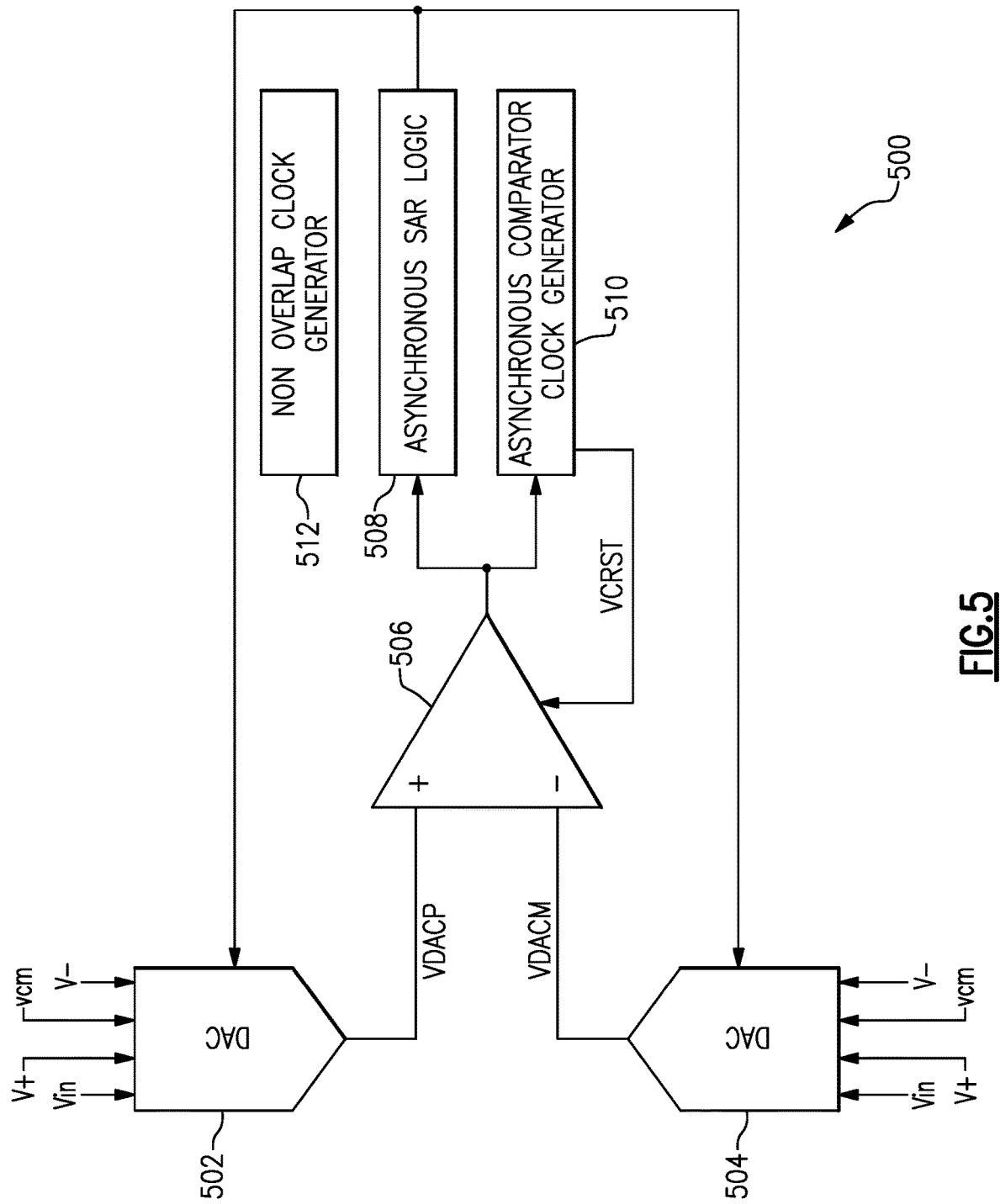
FIG. 5 illustrates an asynchronous SAR ADC from a high level according to an example.

FIG. 5 illustrates an asynchronous SAR ADC 500 from a high level according to an example. The SAR ADC 500 includes a first dynamic element matching network Digital-to-Analog Converter 502 ("DAC 502"), a second dynamic element matching network Digital-to-Analog Converter 504 ("DAC 504"), a comparator 506, an asynchronous SAR ADC logic block 508, an asynchronous clock control circuit 510 ("ACC 510"), and a non-overlapping clock generator 512 ("clock generator 512"). The comparator 506 includes, in some examples, the comparator of the edge detector (e.g., edge detector 26, comparator 118). The ACC 510 includes, in some examples, one or more of the pulse generator, clocked delay loop, and edge selector (e.g., the pulse generator 22, clocked delay loop 24, edge selector 28 of FIG. 2A).

The DACs 502, 504 receive input signals (as shown in the diagram, each DAC 502, 504 receives four input signals, including signals called Vin, V+, V−, and Vcm). The first DAC 502 provides a signal based on the input signals to the positive input of the comparator 506, and the second DAC 504 provides a signal based on the input signals to the negative input of the comparator 506. The comparator 506 generates an output signal based on the inputs it receives, and provides the output signal to the asynchronous SAR ADC logic block 508 and the ACC 510.

The asynchronous SAR ADC logic block 508 converts the signal received from analog to digital form. The asynchronous SAR ADC logic block 508 may have a set amount of time to complete the conversion of a given signal. For example, the asynchronous SAR ADC logic block 508 may have 20 ns to convert the output of the comparator 506 from analog to digital form. The ACC 510 also receives the output of the comparator 506 and determines how many edges are detected within a time frame allocated for conversion of the output signal from analog to digital form. For example, the ACC 510 may determine that, in the 20 ns allocated for conversion of the output signal of the comparator 506, that m edges are detected. The asynchronous SAR ADC logic block 508 may have a resolution of n bits. The ACC 510 may, therefore, operate as the other ACCs described herein and adjust the length of each pulse (i.e., increase the time between edge detections) by applying a delay. The ACC 510 may, if n is less than m, increase the delay applied. The ACC 510 may, if n is greater than m, decrease the delay applied. If n and m are equal, the ACC 510 may not adjust the delay at all. In general, the ACC 510 may be configured to maximize the delay applied such that asynchronous SAR ADC logic block 508 has as much time as possible to perform the analog-to-digital conversion of the output signal from the comparator 506.

Figure 6:
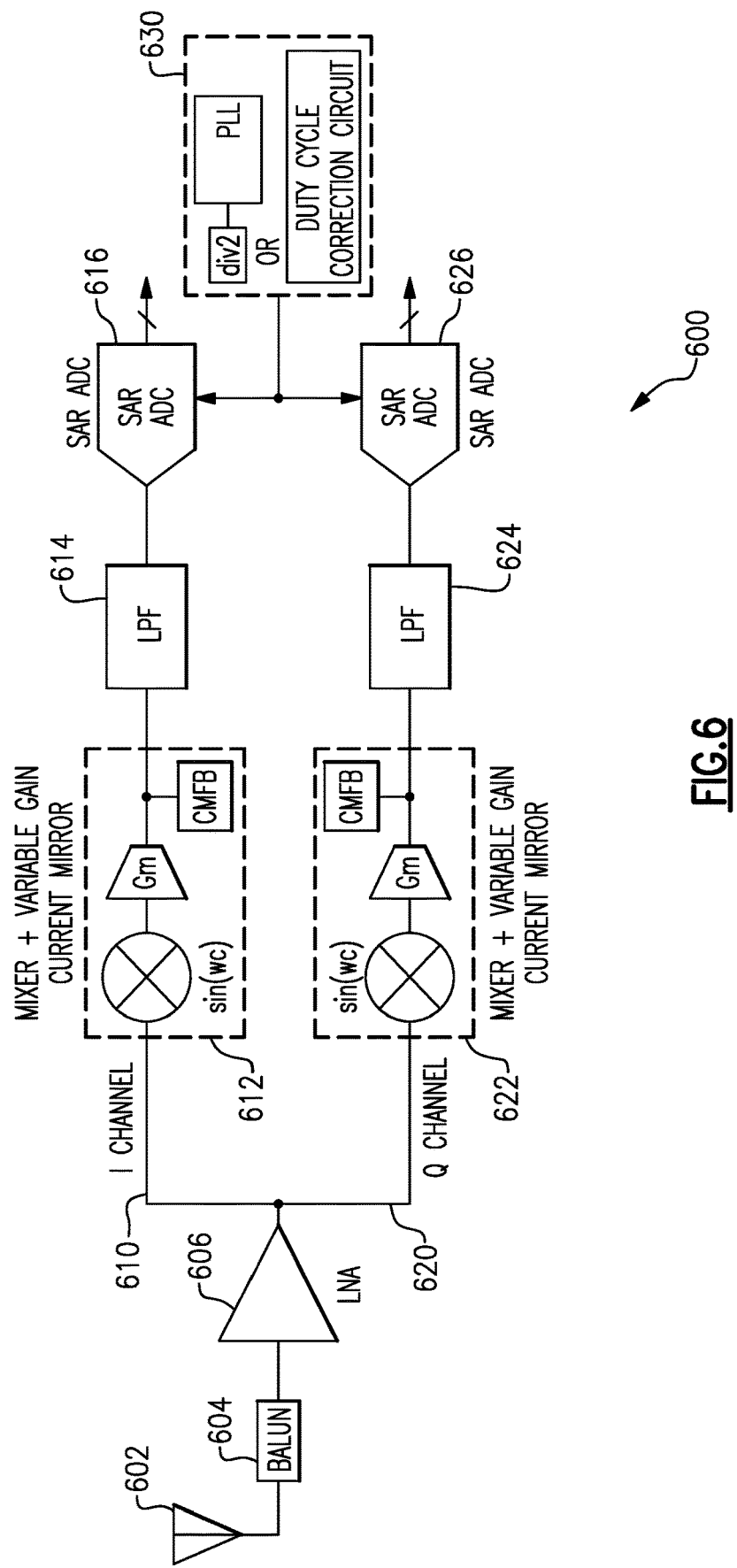
FIG. 6 illustrates an audio receiver according to an example.

The clock generator 512 provides an independent clock signal to one or more of the other circuit components. The independent clock signal may be used as a control signal or to convert and/or manage between various asynchronous signals (e.g., two or more asynchronous signals). FIG. 6 illustrates an audio receiver 600 according to an example. The audio receiver 600 is one example of an application where the methods and systems described herein for applying delay using an asynchronous clock control circuit may be applied.

The audio receiver 600 includes an antenna 602, a balun transformer 604, a low noise amplifier 606 ("LNA" 606"), a first channel 610 having a first mixer 612, a first low pass filter 614 ("LPF 614"), and a first SAR ADC 616, and a second channel 620 having a second mixer 622, a second low pass filter 624 ("LPF 624"), and a second SAR ADC 626. A common clock circuit 630 is also included.

The antenna 602 is coupled to the balun transformer 604, and the balun transformer 604 is coupled to the LNA 606. The LNA 606 is coupled to both the first and second channels 610, 620. Within the channels 610, 620, the mixers 612, 622 are coupled to the respective LPFs 614, 624, and the LPFs 614, 624 are coupled to the respective SAR ADCs 616, 626. Each SAR ADC 616, 626 is coupled to the common clock circuit 630. Each SAR ADC 616, 626 also includes an output for providing, to a circuit, a digital signal corresponding to a converted analog signal.

The antenna 602 receives a signal from some device. The antenna 602 provides the signal to a balun transformer 604 that converts the signal from single-ended to dual-ended (or vice-versa). The balun transformer 604 then provides the signal to the LNA 606 which amplifies the signal and provides the signal to the two channels 610, 620. The first channel 610 processes the signal from the LNA 606 through a mixer 612. The mixer 612 may modify the signal in various way, such as by applying effects of applying gain to the signal. The mixer 612 then provides the signal to the LPF 614 which filters the signal. The signal is then provided from the LPF 614 to the SAR ADC 616.

The second channel 620 operates similarly, providing the signal to the second mixer 622, the second LPF 624, and the second SAR ADC 626.

The common clock circuit 630 provides a common clock signal to each SAR ADC 616, 626, and—in some cases—to the individual components of the SAR ADCs 616, 626. The SAR ADCs 616, 626 convert the signal from analog to digital form and provide it to an output where the converted signal may be used by another circuit.

The SAR ADCs 616, 626 include an asynchronous clock control circuit (e.g., ACC 20, 200) that can adjust the variable delay so that the SAR ADCs 616, 626 may use as much of the time allocated for SAR ADC conversion as possible. In some examples, each SAR ADC 616, 626 may have the same delay, but in other examples each SAR ADC 616, 626 may have different delays.

PVT factors include at least one or more of process, temperature, and voltage, and may include other factors as well. PVT factors are factors that impact the performance of the circuit, especially with respect to the speed of operation of the circuit or components of the circuit. For example, many circuits perform differently at different temperatures, potentially operating faster or slower depending on the temperature. Likewise, in some examples, a circuit might operate faster or slower depending on the voltage provided to drive it (for example, a circuit might tend to operate faster at higher voltages and slower at lower voltages). Process can also impact circuit performance. Process refers to the physical composition of the circuit itself. Due to manufacturing differences between nominally identical circuits, one nominally identical circuit may be faster or slower than another (e.g., due to having slower, though nominally identical, transistors along a critical path).

Various controllers, such as one or more processors, microprocessor circuits, ASICs, FPGAs, or other circuits, may execute various operations discussed above. Using data stored in associated memory and/or storage, the controller also executes one or more instructions stored on one or more non-transitory computer-readable media, which the controller may include and/or be coupled to, that may result in manipulated data. In some examples, the controller may include one or more processors or other types of controllers. In one example, the controller is or includes at least one processor. In another example, the controller performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. A system for determining a variable delay provided to a pulse generator for an analog-to-digital converter (ADC), the system comprising:
   an edge selector configured to determine the variable delay based on a number of edges of a signal from the ADC detected in a period of time;
   a delay loop coupled to the edge selector and configured to provide the variable delay to the pulse generator, the pulse generator being configured to provide an output signal based on the variable delay.

2. The system of claim 1 wherein the edge selector further comprises
   a comparator to compare the number of edges to a target number of edges,
   an edge counter to determine the number of edges and provide the number of edges to the comparator, and
   a delay counter to set the variable delay based on the number of edges and the target number of edges.

3. The system of claim 2 wherein the delay counter is configured to decrease the variable delay when the number of edges is less than the target number of edges and increase the variable delay when the number of edges is greater than the target number of edges.

4. The system of claim 1 wherein the pulse generator is configured to provide the output signal to the ADC, the output signal being a pulse having a width based on the variable delay.

5. The system of claim 1 wherein the ADC has the period of time to complete conversion of a signal from analog to digital form.

6. The system of claim 5 wherein the edge selector adjusts the variable delay such that the ADC utilizes as much of the period of time to complete conversion of the signal as possible without experiencing rollover.

7. The system of claim 1 wherein the variable delay circuit includes at least one register having a plurality of values, each of the values of the plurality of values corresponding to a given length of the variable delay, the at least one register configured to be set by the edge selector.

8. A method of utilizing a period of time available to a circuit to complete an operation, the method comprising:
   determining a number of edges detected in the period of time;
   determining a variable delay based on the number of edges detected and a target number of edges; and
   adjusting, based on the variable delay, a width of one or more pulses used to control the operation during the period of time.

9. The method of claim 8 wherein the operation is converting an analog signal to digital form.

10. The method of claim 8 wherein determining the variable delay includes increasing or decreasing the variable delay depending on the number of edges and the target number of edges.

11. The method of claim 10 wherein the variable delay is increased responsive to determining that the operation will take less time than the period of time and determining that the number of edges is greater than the target number of edges.

12. The method of claim 10 wherein the variable delay is decreased responsive to determining that the number of edges is less than the target number of edges.

13. The method of claim 10 wherein increasing or decreasing the variable delay includes changing the variable delay by a preset amount.

14. The method of claim 8 wherein adjusting the width of the one or more pulses includes adjusting the width in preset increments between a minimum width and a maximum width.

15. A system of utilizing a period of time available to a circuit to complete an operation, the system comprising:
   an analog-to-digital converter (ADC) coupled to a pulse generator, the ADC being configured to convert a plurality of analog values to digital form within the period of time, and the pulse generator being configured to control the ADC to use an amount of time to convert each respective analog value of the plurality of analog values to digital form; and
   an edge selector configured to determine the amount of time based on a number of edges occurring within the period of time and a target number of edges.

16. The system of claim 15 wherein the edge selector includes a first counter to count the number of edges detected during the period of time, a comparator to compare the number of edges detected during the period of time to the target number of edges, and a second counter to determine the amount of time and provide the amount of time to the pulse generator.

17. The system of claim 16 wherein the amount of time increases when the number of edges is greater than the target number during the period of time and decreases when the number of edges is less than the target number during the period of time.

18. The system of claim 15 wherein the pulse generator controls the ADC to use an amount of time to convert each respective analog value of the plurality of analog values to digital form by providing a pulse having a width based on the amount of time to the ADC.

19. The system of claim 15 further comprising an audio receiver circuit having an antenna, at least one channel, and an output, the ADC, pulse generator, and edge selector being coupled between the at least one channel and the output.

20. The system of claim 15 wherein each edge of the number of edges corresponds to an edge of an input signal to the ADC.

* * * * *